United States Patent
Wu et al.

(10) Patent No.: US 8,350,365 B1
(45) Date of Patent: Jan. 8, 2013

(54) MITIGATION OF WELL PROXIMITY EFFECT IN INTEGRATED CIRCUITS

(75) Inventors: Yun Wu, San Jose, CA (US); Hong-Tsz Pan, Cupertino, CA (US); Qi Lin, Cupertino, CA (US); Bang-Thu Nguyen, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/005,680

(22) Filed: Jan. 13, 2011

(51) Int. Cl.
*H01L 21/4763* (2006.01)

(52) U.S. Cl. . 257/632; 257/635; 257/638; 257/E21.495; 438/510; 438/514; 438/942

(58) Field of Classification Search .......... 257/632, 257/635, 638, E21.495; 438/510, 514, 942
See application file for complete search history.

(56) References Cited

U.S. PATENT DOCUMENTS

| | | | | |
|---|---|---|---|---|
| 3,560,280 A * | 2/1971 | Nishida | | 438/703 |
| 3,617,391 A * | 11/1971 | Lepselter et al. | | 438/526 |
| 4,104,085 A * | 8/1978 | Zandveld | | 438/527 |
| 4,579,626 A * | 4/1986 | Wallace | | 438/79 |
| 4,607,429 A * | 8/1986 | Kosonocky | | 438/79 |
| 4,968,641 A * | 11/1990 | Kalnitsky et al. | | 438/439 |
| 5,888,887 A * | 3/1999 | Li et al. | | 438/525 |
| 6,566,214 B1 * | 5/2003 | Lyons et al. | | 438/305 |
| 6,774,033 B1 * | 8/2004 | Ben-Tzur et al. | | 438/643 |
| 2006/0065939 A1 * | 3/2006 | Doczy et al. | | 257/412 |
| 2009/0174009 A1 * | 7/2009 | Usujima et al. | | 257/392 |
| 2010/0035420 A1 * | 2/2010 | Tamaso et al. | | 438/514 |

OTHER PUBLICATIONS

Polishchuk, Igor et al., "Implant Process Modifications for Suppressing WPE," *Solid State Technology*, Apr. 1, 2006, vol. 49, Issue 4, pp. 1-5, Penwell Publishing, Tulsa, Oklahoma, USA.

* cited by examiner

*Primary Examiner* — Angel Roman
(74) *Attorney, Agent, or Firm* — Scott Hewett; LeRoy D. Maunu

(57) ABSTRACT

A hard implantation mask layer is formed on a semiconductor wafer. An etch mask layer is formed on the hard implantation mask layer and patterned. The hard implantation mask layer is etched to form a well implantation pattern and ions are implanted into the semiconductor wafer to form wells in the semiconductor wafer, in areas where the semiconductor wafer is not covered by the well implantation mask.

14 Claims, 6 Drawing Sheets

MITIGATION OF WELL PROXIMITY EFFECT IN INTEGRATED CIRCUITS

FIELD OF THE INVENTION

An embodiment of the invention relates generally to integrated circuits (ICs) and more particularly to techniques for reducing edge-related ion implantation scattering into semiconductor wells.

BACKGROUND

CMOS circuits are used in a variety of integrated circuit (IC) applications. A CMOS process can be used to fabricate many different sorts of functionality, such as memory, logic, and switching, and thus CMOS techniques are particularly desirable in applications where an IC includes several different types of functional blocks.

One family of ICs employing CMOS fabrication techniques are programmable logic devices (PLDs). PLDs are a well-known type of integrated circuit that can be programmed to perform specified logic functions. One type of PLD, the field programmable gate array (FPGA), typically includes an array of programmable tiles. These programmable tiles include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

ICs are often fabricated on semiconductor wafers, such as a silicon wafer. A semiconductor can generally be P-type, N-type, or intrinsic (where the P-type species essentially equal the N-type species), which refers to the conductivity type of the semiconductor. A common technique used when fabricating CMOS ICs, which have both NMOS field-effect transistors (FETs) and PMOS FETs is to use a semiconductor wafer with a first conductivity type (e.g., a P-type silicon wafer), and then form what are commonly referred to as wells of the second conductivity type (e.g., N-wells). Wells are formed by doping the silicon with atomic species, such as by diffusion or ion implantation, to a higher level than the substrate to achieve the desired conductivity and conductivity type.

One approach to well formation used in conventional IC fabrication is to use thick photoresist to define a well implantation mask, and then implant the desired dopant species to the desired concentration and depth in the well areas. Generally, windows are opened in the thick photoresist where implantation is to occur, and a field implant is performed. Thick photoresist blocks the ions from reaching the substrate.

Unfortunately, ions scatter when impinging the photoresist. If a scattered ion is sufficiently close to the edge of the photoresist (i.e., close to a window in the photoresist), the ion might scatter into the well area. Such scattering can increase the doping level of the well area next to the well edge. Similarly, ions can be deflected off the side of the photoresist into the well area, also increasing the doping level. The increased doping level can in turn cause a significant difference in the threshold voltage of an FET fabricated near the well edge compared to a FET fabricated further from the well edge. This variation in FET performance is known as well proximity effect (WPE).

WPE is a problem in 90 nm node geometry ICs, and becomes increasingly problematic as the critical dimension of the device (commonly referred to as the node technology) decreases. WPE is generally even more of a problem in 65 nm node geometry ICs, and is expected to have more serious consequences at 20 nm node geometry ICs. Thick photoresist also has lithographic limits that diminish its suitability for small well patterning.

Similarly, as source/drain regions of FETs in an IC become shallower, WPE becomes a more significant contribution to device variation. Device variation is undesirable because many functions of an IC presume that FETs of a particular type are essentially the same and will operate in essentially the same manner. WPE can cause some FETs to operate differently from the rest, which can affect IC operation.

One technique for dealing with WPE is to create sophisticated device models that predict FET operation (e.g., threshold voltage), for different FETs based on where the FET is in relation to the edge of the well. Unfortunately, these models are derived after the IC layout is complete, and while operation of the various FETs is more closely predicted, such techniques do not reduce the distribution of FET performance. In addition to being cumbersome, such techniques add substantial time to the design cycle if the layout of the IC needs to be changed to correct a problem with WPE.

Therefore, techniques for reducing the WPE in small geometry ICs are desirable and useful. It is further desirable and useful to improve well definition in small geometry ICs.

SUMMARY

In one embodiment, an IC is fabricated by forming a hard implantation mask layer on a semiconductor wafer. An etch mask layer is formed on the hard implantation mask layer and patterned. In a particular embodiment, the hard implantation mask layer is a deposited layer of silicon nitride or metal not more than 300 Angstroms thick and the etch mask layer is a layer of photoresist not more than 300 Angstroms thick. The hard implantation mask layer is etched to form a well implantation mask and ions are implanted into the semiconductor wafer to form first wells in the semiconductor wafer in areas where the wafer is not covered by the well implantation mask. In a further embodiment, after patterning the hard implantation mask layer to form the well implantation pattern, the sidewalls of the hard implantation mask layer are tapered. In a particular embodiment, the sidewalls are tapered to an angle between seventy degrees and eighty degrees from a surface of the semiconductor wafer, which in a particular embodiment is a silicon wafer.

In one embodiment, the hard implantation mask layer is removed from the semiconductor wafer after implanting ions into the semiconductor wafer to form wells. The semiconductor wafer is further processed to fabricate ICs. In a further embodiment, the first wells are of a first conductivity type, and second wells of a second conductivity type are formed in the semiconductor wafer. In a more particular embodiment, the semiconductor wafer is processed to fabricate a field programmable gate array integrated circuit.

In another embodiment, a partially fabricated semiconductor wafer includes a semiconductor substrate and an ion implantation hard mask layer not more than 300 Angstroms thick disposed on the semiconductor substrate. A photoresist layer not more than 300 Angstroms thick is disposed on the ion implantation mask layer. In a particular embodiment, the ion implantation hard mask layer comprises silicon nitride or tungsten. In a particular embodiment, the ion implantation hard mask is a tungsten layer not more than 200 Angstroms thick.

In another embodiment, a partially fabricated semiconductor wafer includes a semiconductor substrate and an ion implantation hard mask layer not more than 300 Angstroms thick disposed on the semiconductor substrate and an implantation well formed in the semiconductor substrate in areas where the ion implantation hard mask layer is not covering the semiconductor substrate. In a further embodiment, the sidewalls of the ion implantation hard mask layer are tapered to form an angle between seventy degrees and eighty degrees with a surface of the semiconductor substrate. In a particular embodiment, the ion implantation hard mask layer comprises silicon nitride. In another embodiment, the ion implantation hard mask layer comprises or tungsten, which in a particular embodiment is not more than 200 Angstroms thick.

BRIEF DESCRIPTION OF THE DRAWINGS

FIG. 1-2 is a cross section of ion implantation to form wells in a semiconductor wafer according to a prior art technique illustrating sidewall scattering.

FIG. 2 is a cross section of a portion of a semiconductor wafer during well ion implantation according to an embodiment.

FIG. 4-1 is a cross section of a portion of a semiconductor wafer suitable for an embodiment.

FIG. 4-2 is a cross section of the portion of the semiconductor wafer of FIG. 4-1 with an implantation hard mask layer according to an embodiment.

FIG. 4-3 is a cross section of the portion of the semiconductor wafer of FIG. 4-2 with a patterned photoresist etch mask layer according to an embodiment.

FIG. 4-4 is a cross section of the portion of the semiconductor wafer of FIG. 4-3 with the etch mask and an etched ion implantation hard mask layer according to an embodiment.

FIG. 4-5 is a cross section of the portion of the semiconductor wafer of FIG. 4-4 after the photoresist layer has been removed and after side wall tapering of the patterned implantation hard mask according to an embodiment.

FIG. 4-6 is a cross section of the portion of the semiconductor wafer of FIG. 4-5 with a patterned hard implantation mask layer during well ion implantation according to an embodiment.

FIG. 4-7 is a cross section of the portion of the semiconductor wafer of FIG. 4-6 with an implanted well region according to an embodiment.

FIG. 4-8 is a cross-section of the portion of the semiconductor wafer of FIG. 4-7 after the implantation hard mask layer has been removed FIG. 5 is a flow chart of a method of fabricating an IC according to an embodiment.

FIG. 6 is a floorplan of a programmable logic device with wells formed according to one or more embodiments.

DETAILED DESCRIPTION

Figure 1:
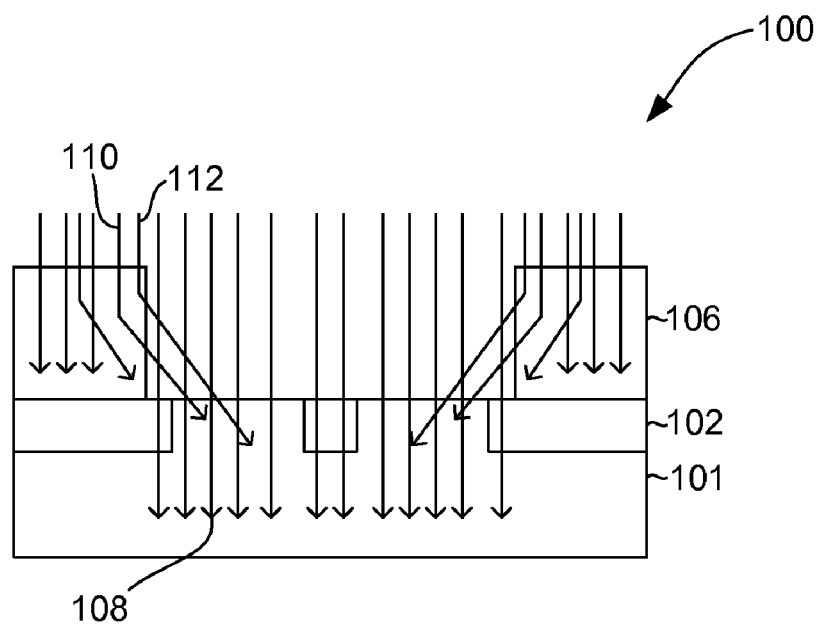
FIG. 1-1 is a cross section of ion implantation to form wells in a semiconductor wafer according to a prior art technique illustrating lateral scattering.

FIG. 1-1 is a cross section of a portion of a semiconductor wafer 100 showing ion implantation to form wells in a semiconductor substrate 101 according to a prior art technique illustrating lateral scattering. As used herein, the term semiconductor wafer includes composite wafers, such as semiconductor-on-insulator, composite semiconductor wafers (e.g., Si—Ge), and silicon wafers, for example, and generally includes features resulting from processing the wafer into ICs. As used herein, a semiconductor substrate is the semiconductor portion of the semiconductor wafer.

Shallow trench isolation 102 is formed in the semiconductor substrate 101, as is well known in the art. Kinetic ions, represented by arrows 104, impinge the semiconductor substrate 101. The ions are generally of a selected species and charge and are accelerated toward the wafer in an ion implantation process, several of which are known in the art of IC fabrication. A thick photoresist mask 106 blocks the ions from penetrating into the wafer below the thick photoresist mask, while areas of the wafer that are not covered by the thick photoresist mask are implanted with ions to form a conductive well. As is known in the art of IC fabrication and more particularly CMOS IC fabrication, a well of a first conductivity type (e.g., an N-type well) is formed in a silicon wafer of a second conductivity type (e.g., a P-type wafer) by implanting ions that dope the silicon to become an N-type semiconductor.

The dose of implanted species is carefully controlled to achieve a desired doping concentration in the silicon. The doping concentration in the field that is not covered by thick photoresist is intended to be uniform. Uniform well doping is desired because attributes of the subsequent field-effect transistors (FETs) fabricated in the wells, such as threshold voltage (Vt), depend on the doping concentration. Uneven well doping can result in FETs near the edge of the well having significantly different Vt (e.g., about 60 mV in a 90 nm node geometry IC). The kinetic ions interact with the material they impinge, and scatter. Ions 110, 112 impinging on the thick photoresist scatter into the adjacent silicon, raising the doping concentration in the silicon near the well edge. This is known as the well proximity effect (WPE). Other ions scatter in other directions, such as into the photoresist; however, these ions are omitted from the figures herein for simplicity and clarity of illustration.

WPE is essentially a variation in well doping concentration. In addition to WPE being more of a problem in smaller node geometries (also generally referred to in terms of critical dimension (CD)), doping variations arising as a result of WPE are also more of a problem with shallower source/drain devices, because the additional doping arising from WPE tends to be concentrated in the upper region of the silicon wafer.

Photoresist has a relatively low ion capture cross section. The ion implantation photoresist mask layer is relatively thick, typically about 1 micron to a few microns. Patterning a thick photoresist layer results in less precise definition than is achievable with a thinner photoresist layer. Although wells are relatively large features of ICs and photoresist layers sufficiently thick to provide ion implantation masking have provided sufficient resolution for wells in relatively large node geometry ICs, patterning thick photoresist layers for ion implantation masks is expected to not provide sufficient resolution for fine geometry ICs, such as ICs having a node geometry of 95 nm or lower, and especially for node geometries less than about 45 nm. Another issue with thick photoresist ion implantation layers is sidewall scattering, where ions hit the sidewall of the photoresist and are deflected back into the exposed silicon. Generally, a higher wall will result in more deflections.

Figures 1, 2:
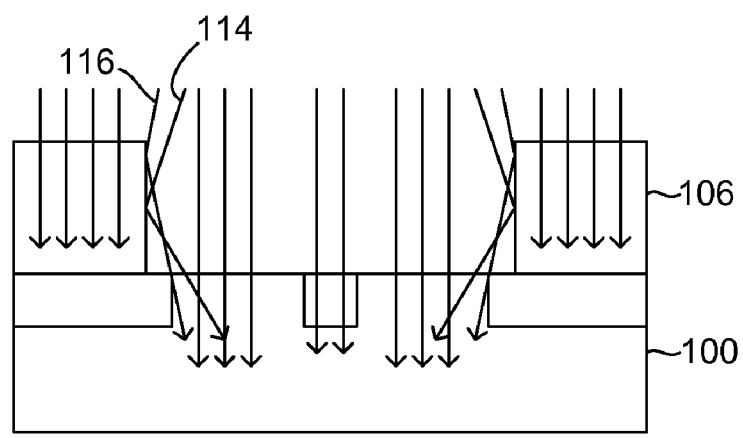
Figure 2:
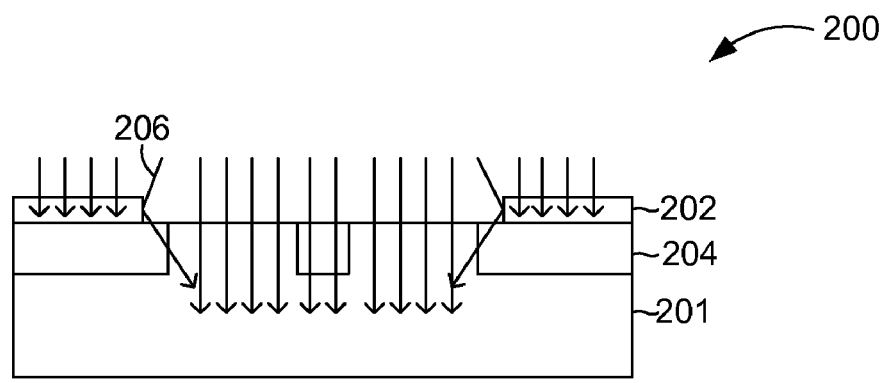

FIG. 1-2 is a cross section of ion implantation to form wells in a semiconductor wafer according to a prior art technique illustrating sidewall scattering. Ions 114, 116 are deflected off the sidewalls of the thick photoresist 106 into the silicon wafer 100. Higher sidewalls present more area for the ions to deflect off of. While kinetic ions in an ion implantation process move in a generally parallel fashion, some ions travel off-axis and hence hit the side walls. The angles of ions 114, 116 in FIG. 1-2 are exaggerated for purposes of illustration. Deflected ions raise the doping concentration near the edge of the well.

FIG. 2 is a cross section of a portion of a semiconductor wafer 200 during well ion implantation according to an embodiment. A hard implantation mask layer 202 has been patterned on the semiconductor wafer 200. Shallow trench isolation 204 is optionally formed in the semiconductor substrate 201 prior to implantation. In a particular embodiment, the hard implantation mask layer 202 is a layer of silicon nitride approximately 200 Angstroms to about 300 Angstroms thick. In another embodiment, the stack height of the implantation mask is less than 100 Angstroms thick. The thickness of the implantation mask layer is generally chosen according to the implantation species and implantation energy, which determine the depth distribution of the implanted species, and the implantation mask material. Silicon nitride has a greater ion capture cross section than photoresist, so a much thinner layer of silicon nitride, compared to photoresist, achieves the desired implantation masking (ion blocking) effect.

Some ion implantation techniques produce ion beams in which some of the ions are not traveling exactly perpendicularly to the surface of the wafer. Such ions are referred to as tilted ions, and have a greater chance of being deflected off of a vertical implantation mask sidewall into the well. The thin hard implantation mask presents a low sidewall and reduces sidewall scattering from tilted ions 206. Lateral scattering is reduced, because the portion of the sidewall that might reflect tilted ions into the substrate is reduced with a thinner implantation mask layer.

Figure 3:
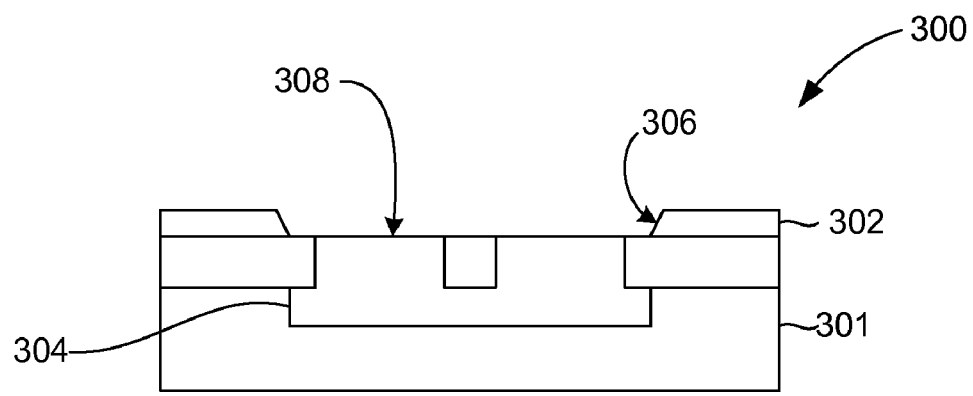
FIG. 3 is a cross section of a portion of a semiconductor wafer with a well mask and well according to an embodiment.

FIG. 3 is a cross section of a portion of a semiconductor wafer 300 with a well mask layer 302 and well 304, according to an embodiment. The well mask layer 302 has a sloped sidewall 306 forming an angle with the surface 308 of the semiconductor wafer between about seventy degrees and about eighty degrees. The sloped sidewall reduces sidewall and lateral scattering, and hence WPE, because an ion hitting the sloped sidewall is less likely to be deflected off the sloped sidewall into the adjacent portion of the well, and an ion hitting the mask layer near the edge of the mask is less likely to be laterally deflected into the adjacent well.

Figures 1, 4:
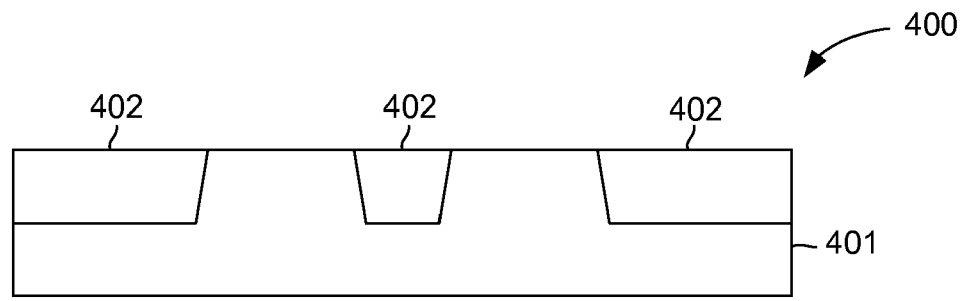
Figures 2, 4:
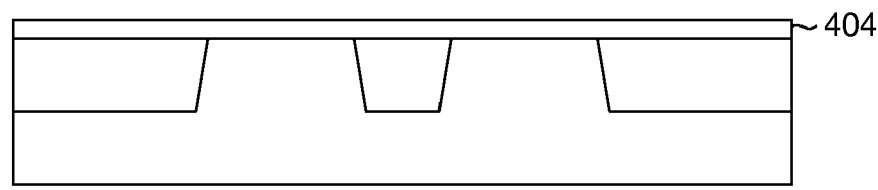
Figures 3, 4:
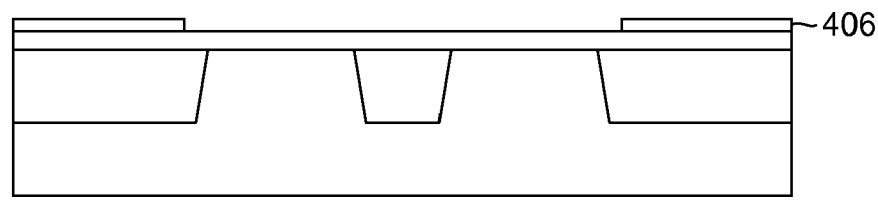
Figure 4:
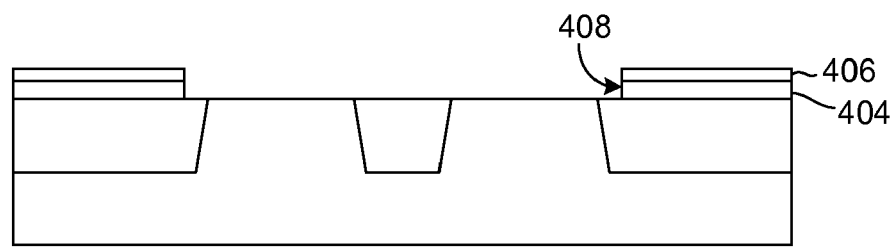

FIG. 4-1 is a cross section of a portion of a semiconductor wafer 400 suitable for an embodiment. As used herein, the term semiconductor wafer includes composite wafers, such as semiconductor-on-insulator, composite semiconductor wafers (e.g., Si—Ge), and silicon wafers, for example. Shallow trench isolations 402 are optionally formed in the semiconductor substrate 401.

FIG. 4-2 is a cross section of the portion of the semiconductor wafer of FIG. 4-1 with an implantation hard mask layer 404, according to an embodiment. In a particular embodiment, the hard mask layer 404 is a layer of silicon nitride about 200 Angstroms to about 300 Angstroms thick. In an alternative embodiment, the implantation hard mask layer 404 is a tungsten layer about 100 Angstroms thick to about 200 Angstroms thick. In another alternative embodiment, the implantation hard mask layer 404 is nickel. It is generally desirable that the hard mask material have relatively high density to block implant ions and be of a type that does not contaminate the semiconductor IC or the process equipment.

FIG. 4-3 is a cross section of the portion of the semiconductor wafer of FIG. 4-2 with a patterned photoresist layer 406, according to an embodiment. The photoresist layer 406 serves as an etch mask in a subsequent etching process. The patterned photoresist layer is a thin layer of photoresist, typically about one tenth the thickness of a photoresist layer used for masking ion implantation. The thin photoresist layer provides higher resolution and finer features than a thicker photoresist layer would provide. In a particular embodiment, the photoresist layer 406 is about a few hundred Angstroms thick. In a particular embodiment, the thin photoresist layer 406 is not more than 0.3 microns thick, which is sufficiently thick to serve as an etch mask to the implantation layer but would generally be insufficient to block ions during the well implantation process. In a more particular embodiment, the thin photoresist layer is not more than 0.1 microns thick, which provides superior photolithographic resolution compared to the thick photoresist layers used for ion implantation blocking.

FIG. 4-4 is a cross section of the portion of the semiconductor wafer of FIG. 4-3 with the patterned photoresist layer 406 used as an etch mask to etch the implantation hard mask layer 404, according to an embodiment. In a particular embodiment, an anisotropic etch technique, such as a capacitively coupled plasma etch technique, is used to remove the hard implantation mask layer where it is not covered by photoresist, without unduly etching the silicon or shallow trench isolation oxide (commonly known as a materials-selective etch process). The etch process forms relatively vertical sidewalls 408 on the patterned hard implantation mask layer (well implantation mask). Vertical sidewalls 408 are used in some embodiments. In alternative embodiments, the sidewalls are tapered.

Figures 4, 5:
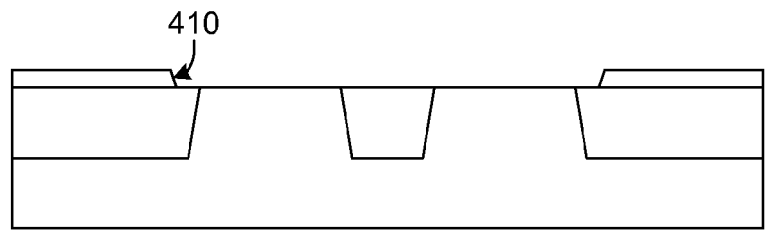

FIG. 4-5 is a cross section of the portion of the semiconductor wafer of FIG. 4-4 after the photoresist layer has been removed and after side wall tapering 410 of the patterned implantation hard mask (well implantation mask), according to an embodiment. An isotropic etch technique, such as a wet etch or isotropic plasma etch, is used to form a tapered sidewall between about seventy degrees to about eighty degrees from the surface of the wafer (i.e., ten to twenty degrees off perpendicular). The taper is exaggerated in the figures herein, for purposes of illustration. The taper is formed essentially because the isotropic etch removes implantation mask material from both the sidewall and the top of the layer, which causes corners to be removed relatively faster than material in the planar field. The taper etch process removes some material from the field of the implantation mask layer, and the initial layer thickness may be increased to accommodate this reduction in thickness.

Figures 4, 5, 6:
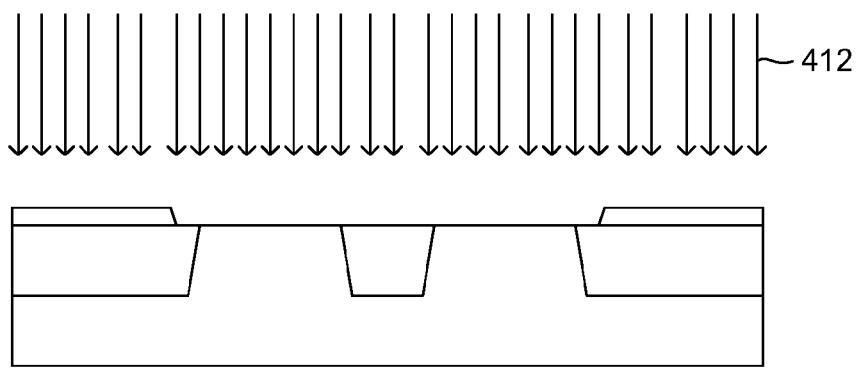
Figures 4, 5, 6, 7:
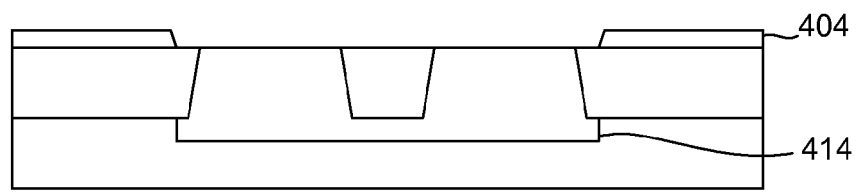
Figures 4, 5, 6, 7, 8:
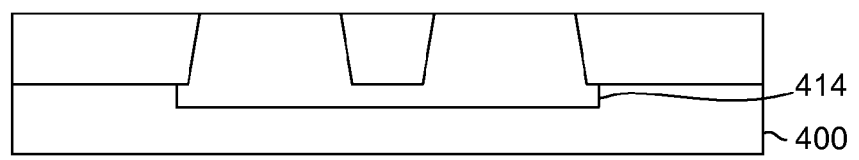
Figure 5:
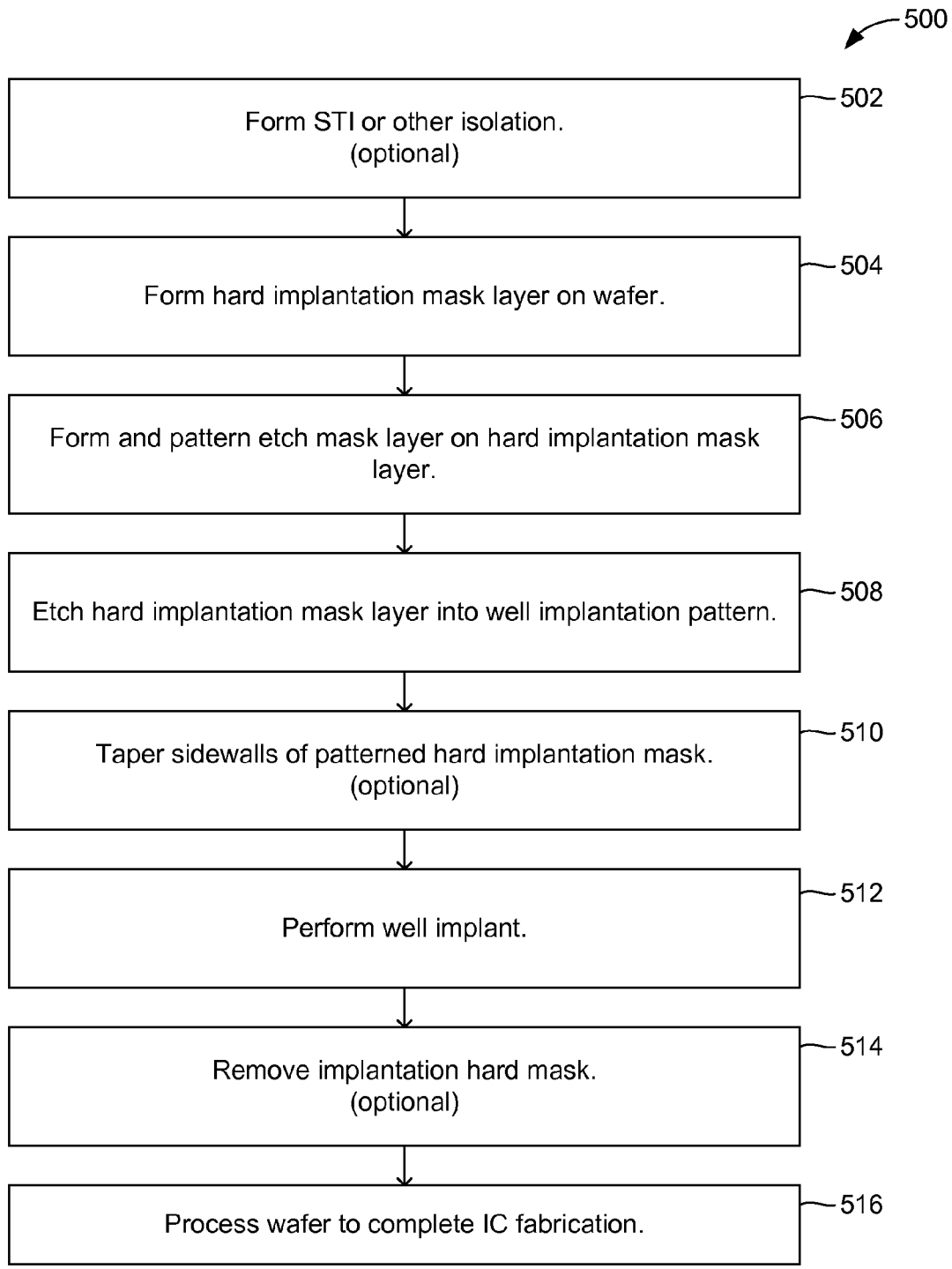
Figure 6:
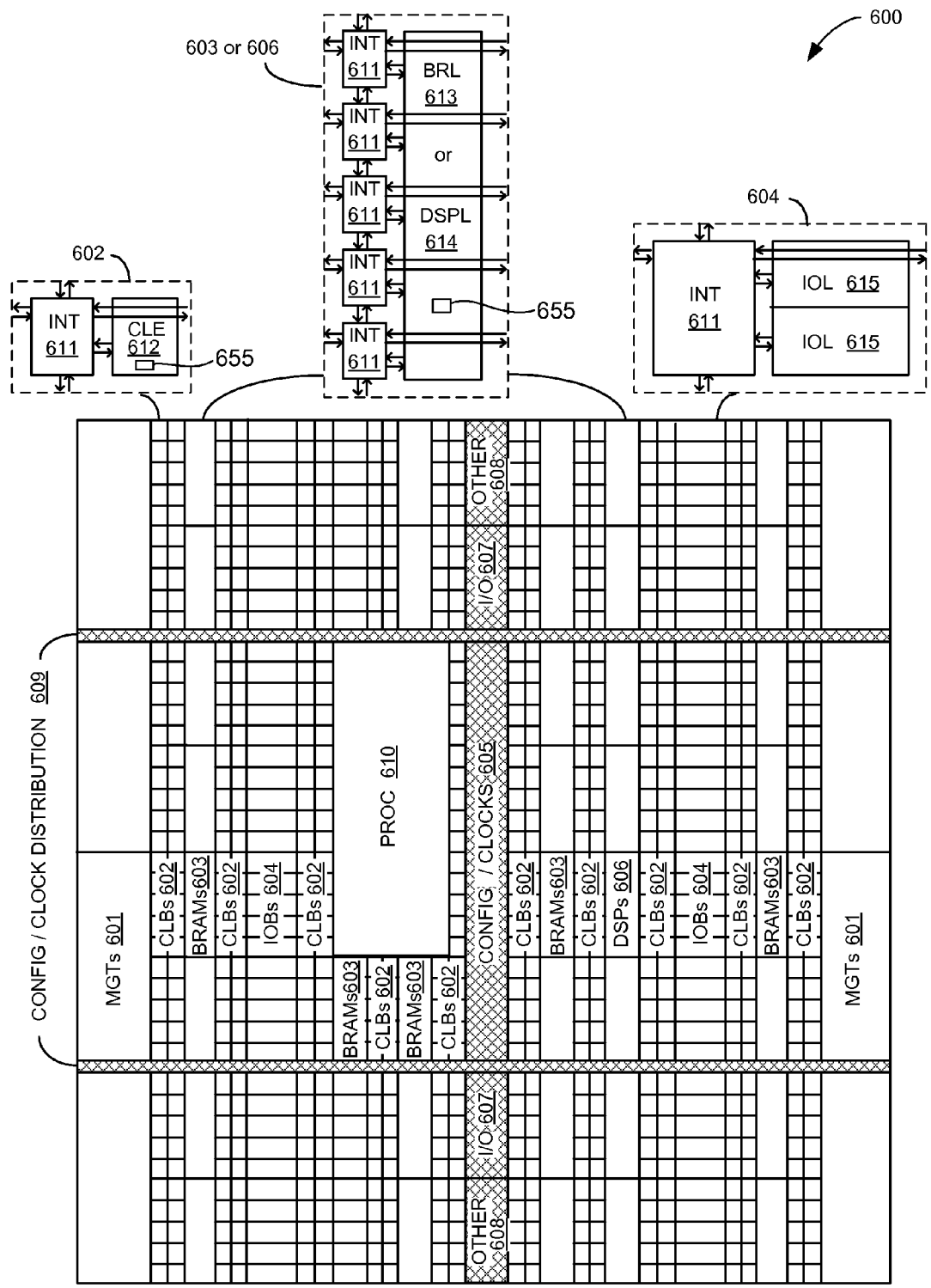

FIG. 4-6 is a cross section of the portion of the semiconductor wafer of FIG. 4-5 with a patterned hard implantation mask layer during well ion implantation (represented by arrows 412), according to an embodiment.

FIG. 4-7 is a cross section of the portion of the semiconductor wafer of FIG. 4-6 with an implanted well region 414, according to an embodiment. The well forms in areas where the hard implantation mask layer 404 is not covering the wafer. In a particular embodiment, hundreds or even thousands of wells are formed in each IC, and each wafer typically has several ICs eventually fabricated on it. After forming the well 414 in the semiconductor wafer 400, the implantation hard mask is optionally removed.

FIG. 4-8 is a cross-section of the portion of the semiconductor wafer of FIG. 4-7 after the implantation hard mask has been removed. The semiconductor wafer is processed through various fabrication sequences to form ICs (not shown), and then the ICs are singulated from the wafer and typically packaged (not shown).

FIG. 5 is a flow chart of a method of fabricating an IC 500, according to an embodiment. Shallow trench isolation is optionally formed in a semiconductor wafer (step 502). Alternatively, another type(s) of isolation dielectric is formed, or other isolation techniques are used. A hard implantation mask layer is formed on the semiconductor wafer (step 504). In a particular embodiment, the hard implantation mask layer is a layer of silicon nitride formed using a deposition process. A hard implantation mask is a mask made of a hard material, such as silicon nitride, silicon, or metal, as opposed to an implantation mask made of photoresist, which is a relatively soft material. In a more particular embodiment, the silicon nitride layer used as the hard implantation mask layer is less than 300 Angstroms thick. In an alternative embodiment, the hard mask layer is tungsten.

An etch mask layer is formed and patterned (step 506) on the hard implantation mask layer. In a particular embodiment, the etch mask layer is a layer of photoresist about a few hundred Angstroms thick or less. The thin layer of photoresist is developable into a more precise dimension (i.e., to provide a more precise well definition) than the thicker photoresist layers typically used as ion implantation masks. Embodiments are used with a variety of well techniques, such as N-well plus P-well or triple-well techniques.

After patterning the etch mask layer, the hard implantation mask layer is etched to form a hard implantation mask pattern (step 508). In a particular embodiment, the hard implantation mask layer is etched using a capacitively coupled anisotropic plasma etch technique. In a further embodiment, the sidewalls of the patterned hard mask layer are tapered (step 510) after the developed etch mask photoresist has been removed, e.g., by performing a wet or dry isotropic etch.

Ions are implanted to form wells in the IC regions of the semiconductor wafer according to the hard implantation mask pattern (step 512). The patterned hard implantation mask layer is optionally removed (step 514), and the wafer(s) are processed to form ICs (step 516), which are singulated from the wafer and typically packaged or otherwise used.

FIG. 6 is a floorplan of a programmable logic device with wells 655 formed according to one or more embodiments. In a particular embodiment, the IC 600 is an FPGA, but is alternatively a different type of IC, such as graphics processor, microprocessor, logic device, or other IC incorporating wells of a first conductivity type formed in a semiconductor wafer of a second (opposite) conductivity type. In a further embodiment, wells of the second conductivity type are also formed in the wafer or in wells of the first conductivity type. The exemplary FPGA of FIG. 6 is fabricated using a CMOS fabrication process or mixed CMOS/NMOS process and incorporates one or more memory cells, according to one or more embodiments of the invention. Wells formed according to one or more embodiments are particularly useful in memory cell blocks, analog RF circuits, or functional blocks where uniform transistor thresholds are desirable (i.e., where well proximity effect is a problem).

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). A differential I/O buffer 618 is also part of IOB 604. As will be clear to those of skill in the art, the actual I/O pads connected, for example, to the differential I/O buffer 618 are manufactured using metal layers above the various illustrated logic blocks, and typically are not confined to the area of the input/output differential I/O buffer 618. In the pictured embodiment, a columnar area 609 near the center of the die is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/ logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative implantation hard mask materials and thicknesses can be used, and multiple types of wells can be formed according to one or more embodiments. Therefore, the spirit and scope of the appended claims should not be limited to the foregoing description.

What is claimed is:

1. A method of fabricating an integrated circuit (IC), comprising:
   forming a hard implantation mask layer on a semiconductor wafer;
   wherein the hard implantation mask layer is a metal layer in direct contact with a surface of the semiconductor wafer;
   forming an etch mask layer on the hard implantation mask layer;
   wherein the etch mask layer is directly in contact with a surface of the hard implementation mask;
   patterning the etch mask layer;
   etching the hard implantation mask layer to form a well implantation mask;
   removing the etch mask layer after the well implantation mask is formed; and
   after removing the etch mask layer, implanting ions into the semiconductor wafer to form first wells in the semiconductor wafer in areas where the semiconductor wafer is not covered by the well implantation mask.

2. The method of claim 1, wherein forming the etch mask layer comprises forming a photo-resist layer not more than 300 Angstroms thick.

3. The method of claim 1, further comprising, after patterning the hard implantation mask layer to form the well implantation mask, tapering sidewalls of the hard implantation mask layer.

4. The method of claim 3, wherein the sidewalls are tapered to an angle between seventy degrees and eighty degrees from a surface of the semiconductor wafer.

5. The method of claim 1, wherein the semiconductor wafer is a silicon wafer.

6. The method of claim 1, further comprising, after implanting ions into the semiconductor wafer to form first wells, removing the hard implantation mask layer from the semiconductor wafer.

7. The method of claim 1, further comprising, after implanting ions into the semiconductor wafer to form first wells, processing the semiconductor wafer to fabricate integrated circuits.

8. The method of claim 1, wherein:
   the first wells are of a first conductivity type; and
   the method further comprises:
      forming second wells of a second conductivity type in the semiconductor wafer; and
      processing the semiconductor wafer to fabricate a field programmable gate array integrated circuit.

9. The method of claim 1, wherein the etching of the hard implantation mask layer forms vertical sidewalls on the hard implantation mask.

10. A semiconductor wafer, comprising:
    a semiconductor substrate;
    an ion implantation hard mask layer not more than 300 Angstroms thick disposed directly on a surface of the semiconductor substrate;
    wherein the ion implantation hard mask layer comprises tungsten; and
    a photo-resist layer not more than 300 Angstroms thick disposed directly on a surface of the tungsten of the ion implantation mask layer.

11. The semiconductor wafer of claim 10, wherein the ion implantation hard mask layer is not more than 200 Angstroms thick.

12. A semiconductor wafer, comprising:
    a semiconductor substrate;
    an ion implantation hard mask layer not more than 300 Angstroms thick disposed directly on a surface of the semiconductor substrate;
    wherein the ion implantation hard mask layer comprises tungsten, the ion implantation hard mask layer having tapered sidewalls; and
    an implantation well formed in the semiconductor substrate in areas where the ion implantation hard mask layer is not covering the semiconductor substrate, the implantation well being uniformly doped.

13. The semiconductor wafer of claim 12, wherein the tapered sidewalls form an angle between seventy degrees and eighty degrees with a surface of the semiconductor substrate.

14. The semiconductor wafer of claim 13, wherein the ion implantation hard mask layer is not more than 200 Angstroms thick.

* * * * *